(12) United States Patent
Amiri et al.

(10) Patent No.: US 10,203,226 B1
(45) Date of Patent: Feb. 12, 2019

(54) PHASE INTERPOLATION CIRCUIT

(71) Applicant: KANDOU LABS, S.A., Lausanne (CH)

(72) Inventors: Omid Talebi Amiri, Chavannes près Renens (CH); Armin Tajalli, Chavannes près Renens (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/675,412

(22) Filed: Aug. 11, 2017

(51) Int. Cl.
*G01D 5/24* (2006.01)
*G01D 5/244* (2006.01)
*G05F 3/26* (2006.01)

(52) U.S. Cl.
CPC ......... *G01D 5/24404* (2013.01); *G05F 3/262* (2013.01)

(58) Field of Classification Search
CPC ............................ G01D 5/24404; G05F 3/262
See application file for complete search history.

(56) References Cited

U.S. PATENT DOCUMENTS

| | | | |
|---|---|---|---|
| 668,687 | A | 2/1901 | Mayer |
| 780,883 | A | 1/1905 | Hinchman |
| 3,196,351 | A | 7/1965 | Slepian |
| 3,636,463 | A | 1/1972 | Ongkiehong |
| 3,939,468 | A | 2/1976 | Mastin |
| 4,163,258 | A | 7/1979 | Ebihara |
| 4,181,967 | A | 1/1980 | Nash |
| 4,206,316 | A | 6/1980 | Burnsweig |
| 4,276,543 | A | 6/1981 | Miller |
| 4,486,739 | A | 12/1984 | Franaszek |
| 4,499,550 | A | 2/1985 | Ray, III |
| 4,722,084 | A | 1/1988 | Morton |
| 4,772,845 | A | 9/1988 | Scott |
| 4,774,498 | A | 9/1988 | Traa |
| 4,864,303 | A | 9/1989 | Ofek |
| 4,897,657 | A | 1/1990 | Brubaker |

(Continued)

FOREIGN PATENT DOCUMENTS

| | | |
|---|---|---|
| CN | 1671092 | 9/2005 |
| CN | 1864346 | 11/2006 |

(Continued)

OTHER PUBLICATIONS

"Introduction to: Analog Computers and the DSPACE System," Course Material ECE 5230 Spring 2008, Utah State University, www.coursehero.com, 12 pages.

(Continued)

*Primary Examiner* — Kabir A Timory
(74) *Attorney, Agent, or Firm* — Invention Mine LLC

(57) ABSTRACT

Methods and systems are described for receiving a control step input at a binary-to-thermometer decoder and responsively generating bits of a thermometer codeword representative of the control step input, providing the bits of the thermometer codeword to a plurality of differential pairs comprising a first transistor and a second transistor, each differential pair configurable for one of directing current to an in-phase (I) common node or directing current to a quadrature phase (Q) common node and switching between directing current to the I common node and the Q common node, and forming an output signal based on current drawn through the I and Q common nodes, the output signal having an intermediate phase with respect to a first and a second reference signal.

20 Claims, 19 Drawing Sheets

(56) References Cited

U.S. PATENT DOCUMENTS

| | | |
|---|---|---|
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,307,906 B1 | 10/2001 | Tanji |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,688,929 B2 | 3/2010 | Co |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,860,190 B2 | 12/2010 | Feller |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |

(56) References Cited

U.S. PATENT DOCUMENTS

| | | |
|---|---|---|
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,791,735 B1 | 7/2014 | Shibasaki |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,544,015 B2 | 1/2017 | Ulrich |
| 9,565,036 B2 | 2/2017 | Zerbe |
| 9,634,797 B2 | 4/2017 | Benammar |
| 9,667,379 B2 | 5/2017 | Cronie |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0092240 A1 | 5/2004 | Hayashi |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2005/0024117 A1 | 2/2005 | Kubo |
| 2005/0063493 A1 | 3/2005 | Foster |
| 2005/0128018 A1 | 6/2005 | Meltzer |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |

(56) References Cited

U.S. PATENT DOCUMENTS

| | | |
|---|---|---|
| 2005/0220182 A1 | 10/2005 | Kuwata |
| 2005/0270098 A1 | 12/2005 | Zhang |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0232461 A1* | 10/2006 | Felder .......... H03M 1/462 341/161 |
| 2006/0233291 A1 | 10/2006 | Garlepp |
| 2006/0291589 A1* | 12/2006 | Eliezer .......... H03C 3/40 375/302 |
| 2007/0001713 A1 | 1/2007 | Lin |
| 2007/0001723 A1 | 1/2007 | Lin |
| 2007/0002954 A1 | 1/2007 | Cornelius |
| 2007/0030796 A1 | 2/2007 | Green |
| 2007/0076871 A1 | 4/2007 | Renes |
| 2007/0103338 A1 | 5/2007 | Teo |
| 2007/0121716 A1 | 5/2007 | Nagarajan |
| 2007/0182487 A1 | 8/2007 | Ozasa |
| 2007/0201546 A1 | 8/2007 | Lee |
| 2007/0201597 A1* | 8/2007 | He .......... H03D 13/005 375/376 |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0088274 A1 | 4/2013 | Gu |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0285720 A1 | 10/2013 | Jibry |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0078495 A1 | 3/2015 | Hossain |
| 2015/0117579 A1 | 4/2015 | Shibasaki |
| 2015/0146771 A1 | 5/2015 | Walter |
| 2015/0222458 A1 | 8/2015 | Hormati |
| 2015/0249559 A1 | 9/2015 | Shokrollahi |
| 2015/0256326 A1 | 9/2015 | Simpson |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| CN | 101478286 | 7/2009 |
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomnn.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

(56) References Cited

OTHER PUBLICATIONS

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Design Brief 208 Using the Anadigm Multiplier CAM, Copyright 2002 Anadigm, 6 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Grahame, J., "Vintage Analog Computer Kits," posted on Aug. 25, 2006 in Classic Computing, 2 pages, http.//www.retrothing.com/2006/08/classic_analog_.html.
Healey, A., et al., "A Comparison of 25 Gbps NRZ & PAM-4 Modulation used in Legacy & Premium Backplane Channels", DesignCon 2012, 16 pages.
International Search Report and Written Opinion for PCT/EP2011/059279 dated Sep. 22, 2011.
International Search Report and Written Opinion for PCT/EP2011/074219 dated Jul. 4, 2012.
International Search Report and Written Opinion for PCT/EP2012/052767 dated May 11, 2012.
International Search Report and Written Opinion for PCT/US14/052986 dated Nov. 24, 2014.
International Search Report and Written Opinion from PCT/US2014/034220 dated Aug. 21, 2014.
International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The streTched-Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Farzan, et al., "Coding Schemes for Chip-to-Chip Interconnect Applications", IEEE Transactions on Very Large Scale Integration (VLSI) Systems, vol. 14, pp. 393-406, Apr. 2006.
Anonymous, "Constant-weight code", Wikipedia.org, retrieved on Jun. 2, 2017.
Reza Navid et al, "A 40 Gb/s Serial Link Transceiver in 28 nm CMOS Technology", IEEE Journal of Solid-State Circuits, vol. 50, No. 4. Apr. 2015, pp. 814-827.
Linten, D. et al, "T-Diodes—A Novel Plus-and-Play Wideband RF Circuit ESD Protection Methodology" EOS/ESD Symposium 07, pp. 242-249.
Hyosup Won et al, "A 28-Gb/s Receiver With Self-contained Adaptive Equalization and Sampling Point Control Using Stochastic Sigma-Tracking Eye-Opening Monitor", IEEE Transactions on Circuits and Systems-I: Regular Papers, vol. 64, No. 3, Mar. 2017. pp. 664-674.

(56) References Cited

OTHER PUBLICATIONS

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

* cited by examiner

US 10,203,226 B1

PHASE INTERPOLATION CIRCUIT

REFERENCES

The following prior applications are herein incorporated by reference in their entirety for all purposes:

U.S. patent application Ser. No. 14/925,686, filed Oct. 28, 2015, naming Armin Tajalli, entitled "Enhanced Phase Interpolation Circuit", hereinafter identified as [Tajalli I].

The following additional references to prior art have been cited in this application:

U.S. Pat. No. 9,208,130, filed Aug. 16, 2012 and issued Dec. 8, 2015, naming Ming-Shuan Chen, entitled "Phase Interpolator", hereinafter identified as [Chen].

BACKGROUND

Clocked digital communications systems often require timing signals which are offset in phase or delay from a known reference clock signal, either to provide an appropriate set-up or hold interval, or to compensate for propagation delay between the point of use and the location of the reference clock source. Systems relying on a single reference clock often utilize fixed or adjustable delay lines or delay circuits to generate a secondary clock signal which is time-offset from the original reference. As another example, a serial communications receiver may have a local clock synthesized from received data transitions, which may be phase-shifted an appropriate amount to allow its use in sampling the received data stream. Alternatively, systems providing a multi-phase reference clock, one example being a two-phase quadrature clock, may utilize phase interpolation techniques to generate a secondary clock signal intermediate to the two reference clock phases; in other words, having a phase offset interpolated between those of the reference clock phases.

Such phase interpolators also found extensive use in RF communications applications, as one example in producing an output signal having a particular phase relationship used to drive one element of a multi-element antenna array, such that the collection of element arrays driven by such output signals resulted in an output beam with the desired directional characteristics.

In one such application, two sinusoidal reference input signals having relative phase relationships of 90 degrees (thus commonly referred to as sine and cosine signals) are presented as inputs to the phase interpolator having an output W of:

$$W = A*\sin(\omega t) + (1-A)*\cos(\omega t) \qquad \text{(Eqn. 1)}$$

where the control input A is varied between (in this example) 0 and 1 to set the relative phase of output W as compared to reference inputs $\sin(\omega t)$ and $\cos(\omega t)$. Following common practice in the art, this document will utilize this well-known phase interpolator nomenclature, without implying any limitation to two clocks having that particular phase relationship, sinusoidal signals, single-quadrant versus multiple-quadrant operation, or a particular domain of applicability.

DETAILED DESCRIPTION

Figure 1:
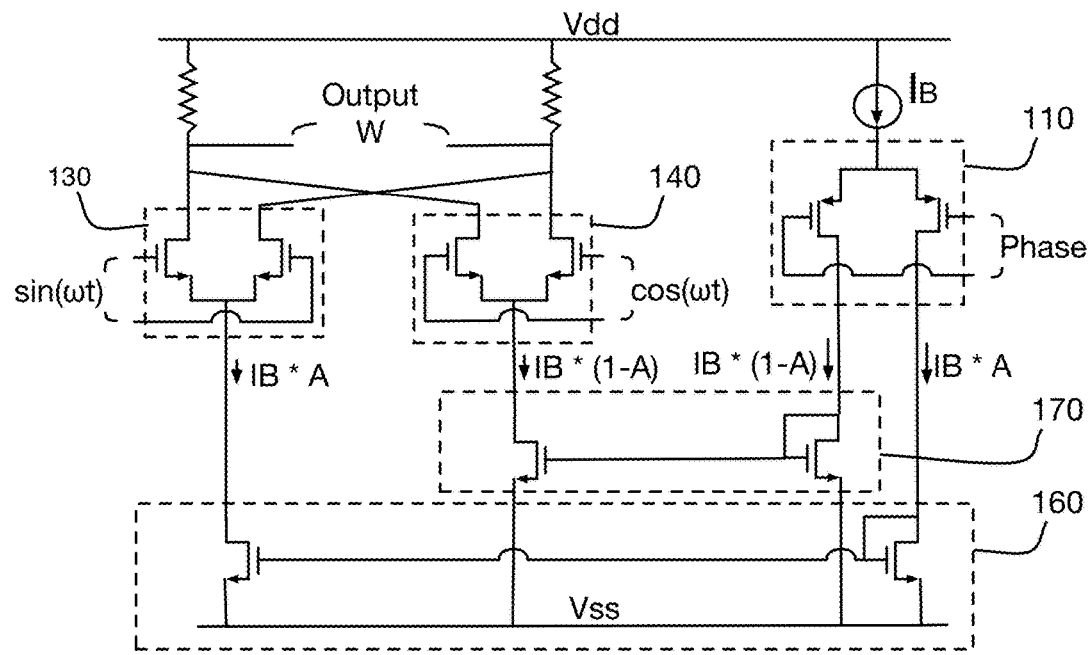
FIG. 1 illustrates one example of a prior art phase interpolation circuit.

FIG. 1 illustrates one example of a prior art phase interpolator circuit suitable for embodiment in, as one example, an integrated circuit. It accepts sinusoidal reference clock inputs having a fixed quadrature phase relationship, identified as $\sin(\omega t)$ and $\cos(\omega t)$, as well as differential control signal inputs A and Á which select the relative phase of an output signal produced at differential output W, as described by Eqn. 1.

As will be well understood by one familiar with the art, the circuit of FIG. 1 utilizes differential transistor pair 110 to partition a fixed source current $I_B$ into two fractional currents $I_B*A$ and $I_B*(1-A)$ as directed by inputs A and Á, those fractional currents thus corresponding to the A and (1−A) factors of Eqn. 1. Fractional current $I_B*A$ is mirrored by current mirror 160 to provide a current sink for differential pair 130, and fractional current $I_B*(1-A)$ is mirrored by current mirror 170 to provide a current sink for differential pair 140. Reference clock signals $\sin(\omega t)$ are input to 130, thus the current flow through 130 is a linear function of both IA and $\sin(\omega t)$. Similarly, reference clock signals $\cos(\omega t)$ are input to 140, thus the current flow through 140 is a linear function of both $I_B*(1-A)$ and $\cos(\omega t)$. As differential transistor pairs 130 and 140 are connected in parallel to load resistors $R_{L1}$ and $R_{L2}$ across which differential output W is produced, output W is derived from the sum of the current flows through 130 and 140, thus representing a physical embodiment of the relationship described by Eqn. 1 above.

In one typical embodiment, output W includes a sinusoidal or approximately sinusoidal linear waveform having a phase relationship intermediate between those of the $\sin(\omega t)$ and $\cos(\omega t)$ reference clock inputs, as controlled by A in the region $0 \leq A \leq 1$. In a further embodiment, outputs W and Ẃ are digital waveforms comprised of edge transitions having the described phase relationship, the digital output conversion occurring through the introduction of such known functional element as a zero-crossing detector, digital comparator, or analog limiter, to convert the sinusoidal result of Eqn. 1 into a digital waveform.

A known limitation of this type of phase interpolation is the non-linear nature of the control relationship between the phase control signal value and the resultant phase offset of the output signal. As will be readily apparent to one familiar with the art, Eqn. 1 implies that the phase of result W varies as $$\arctan\left(\frac{A}{1-A}\right)$$

which is linear near the center of its range (e.g. around A=0.5) but becomes significantly nonlinear as A moves towards its extremes. Thus, a system reliant on a phase interpolator of this type where the phase of W is approximately 45 degrees offset from both the sine and cosine reference clocks would experience relatively smooth and consistent incremental variation of such phase for small incremental adjustments of A. However, as A is adjusted further, the amount of phase change per incremental change of A will begin to deviate from that consistent behavior by a nonlinearly varying amount.

Waveform Effects

For clarity of explanation and consistency with past practice, the previous examples of phase interpolation have assumed orthogonal reference clocks that are pure sinusoids. However, other waveforms and input phase relationships are equally applicable, and indeed other waveforms may be more easily produced within a digital integrated circuit environment than pure sinusoids. As one example, pseudo-sinusoidal waveforms, i.e. those having predominantly sinusoidal characteristics but presenting some amount of residual waveform distortion or additional spectral content, often may be utilized in comparable manner to pure sinusoids.

As one example, logic elements including ring oscillators and buffers operating at or near the frequency limits for a particular integrated circuit process may be observed to produce nearly sinusoidal outputs. This phenomenon may be explained by observing that the Fourier spectrum of a square wave has significant energy only at its fundamental frequency, third harmonic frequency, and subsequent odd harmonic frequencies. Thus, at operating frequencies where the fundamental signal frequency is near the transistor cutoff frequency, that signal's third, fifth, etc. harmonics (necessary to form a conventional square wave digital waveform) will be significantly attenuated, leaving a primarily sinusoidal result.

The relative control signal linearity of a phase interpolator will be dependent on both the actual signal waveforms and on the mixing algorithm used. Perfect triangle wave (e.g. constant slew rate) quadrature reference inputs, for example, are capable of producing completely linear control signal behavior with linear arithmetic summation. [Tajalli I] suggests that reference inputs having rounded (e.g. partial high frequency attenuation) or logarithmic (e.g. RC time constant constrained) rise times may show more linear control signal behavior with square root summation.

Polar Representation of Interpolator

Figure 2:
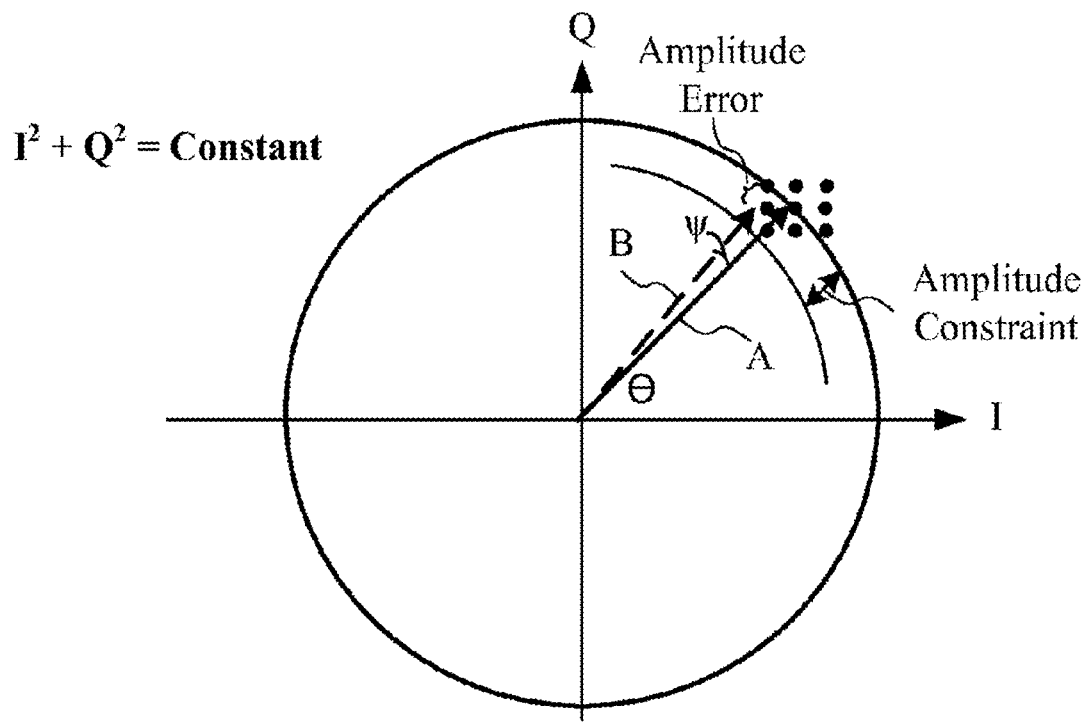
FIG. 2 is a polar representation of signal vector A rotated to a destination B described by orthogonal coordinates I and Q.

FIG. 2 shows the behavior of a phase interpolator as a polar coordinate rotation of a vector A to a destination B defined by orthogonal values I and Q. [Chen] teaches I and Q control signals in the relationship $$I^2+Q^2=\text{constant} \tag{Eqn.2}$$

as part of a described process of clock vector rotation. Some embodiments utilize polar vector rotation to perform clock phase interpolation, but with significantly less circuit complexity and power consumption than such prior art methods. The shaping function of Eqns. 3 and 4 are used on the control signals to minimize error of the rotated vector $$Q==>[0:1:2^n-1], I=\text{round } \sqrt{(R^2-Q^2)} \tag{Eqn. 3}$$

$$R=\sqrt{2}*0.5*(2^n-1) \tag{Eqn. 4}$$

Figure 11:
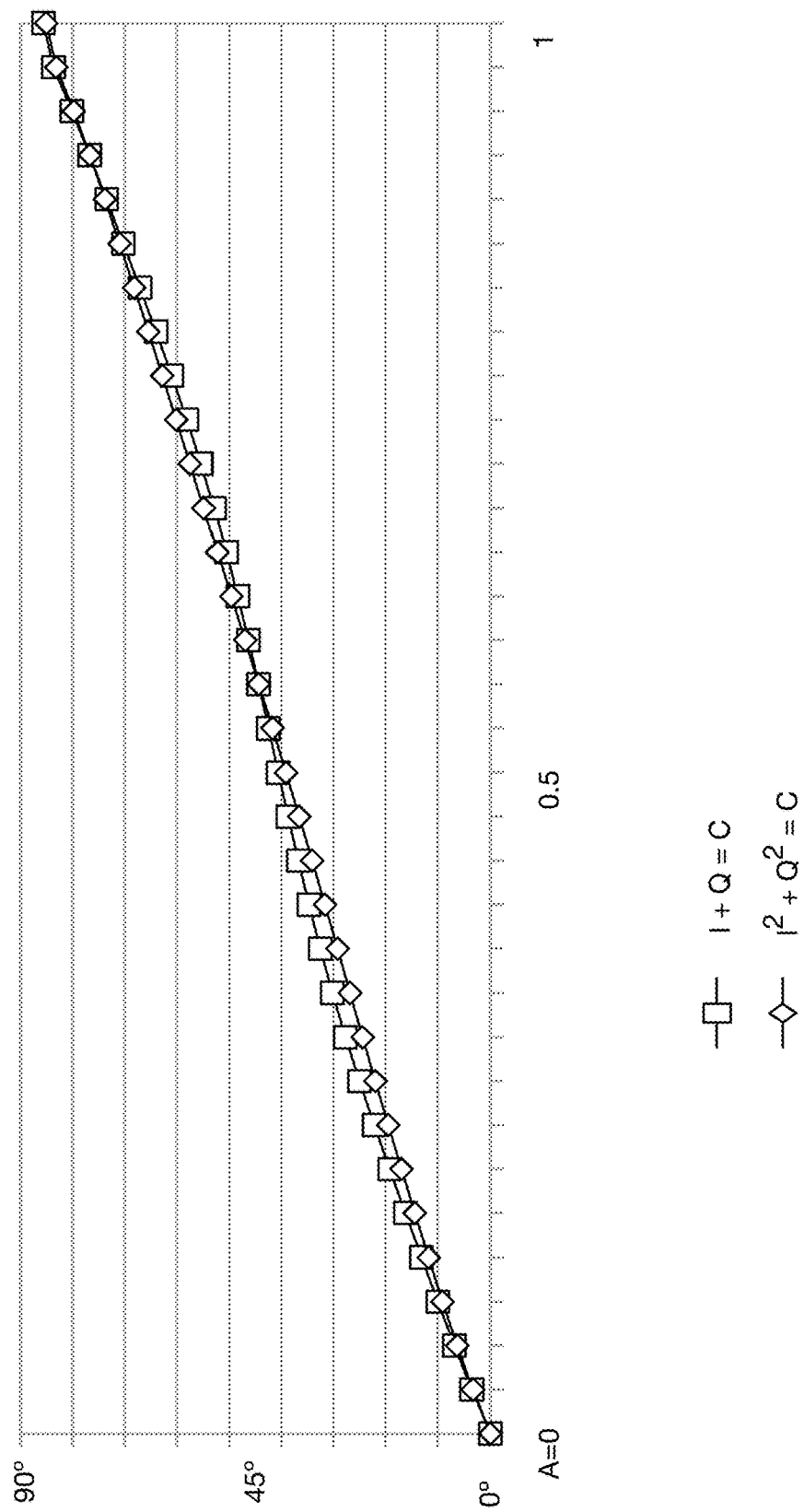
FIG. 11 is a graph illustrating phase linearity in accordance with some embodiments.

The resulting values I and Q may be used directly as the Phase inputs for $\sin(\omega t)$ and $\cosine(\omega t)$ clocks in a phase interpolator such as shown in FIG. 1. In an alterative embodiment, the I and Q signals presented as currents may directly replace the FIG. 1 currents $I_B*A$ and $I_B*(1-A)$ respectively. FIG. 11 illustrates curves showing the linearity of the phase relationships for I+Q=C and $I^2+Q^2$=C. As shown, the $I^2+Q^2$=C relationship has a more linear phase relationship than that of I+Q=C.

Generation of the I and Q signals controlling the clock mixing stages is complicated by the need to not only provide the necessary mapping of values to minimize the resulting vector amplitude and phase errors, but also to do so while minimizing power consumption in the overall circuit. Thus, as one example, generating I and Q values using R-2R resistive ladder DACs might provide sufficient resolution but would draw significant quiescent current. As another example, DACs based on a $2^N$ resistor chain would provide excellent monotonicity and could incorporate the necessary curve matching, but again would draw significant quiescent current.

Figure 3:
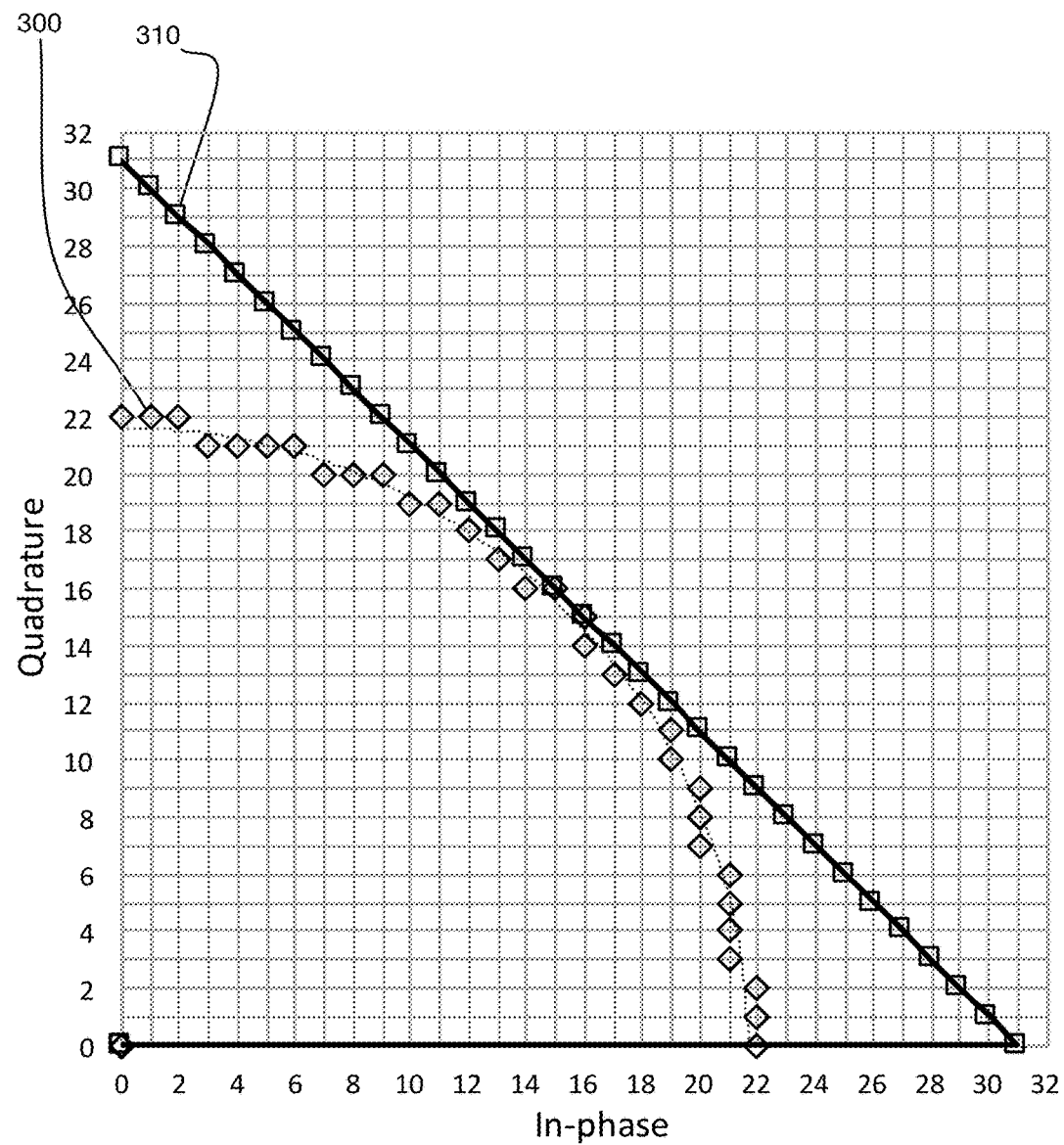
FIG. 3 is a graph showing one embodiment of the fitted curve 300 derived from linear input 310.

As shown in FIG. 3, the I and Q curves 300 defined by Eqns. 3 and 4 are always lower than a straight-line linear increase 310; that is, the necessary curve shaping function only needs to decrease from an input linear value, never to augment it. One efficient embodiment utilizes an encoding of the I and Q control values represented in unary (also known as a "counting" or "thermometer") code. For example, to provide 32 discrete control steps, each code is represented as a set of 0 to 31 enabled digital values (as an example, a grouping of 31 wires carrying that set of digital "1"s). Each enabled element of the set activates a control gate providing a current output, with the sum of all control gate outputs being the analog result of the function. One embodiment incorporates an array of 31 identical NMOS gates to implement each of I and Q, each gate designed to source a fixed amount of current when enabled (the fixed current defined by constraint of the transistor dimensions in one particular embodiment, and by an explicit current source in another particular embodiment). The curve fitting to satisfy Eqn. 3 is obtained by selectively connecting only a chosen subset of the gate outputs to the common summation node.

Figure 4:
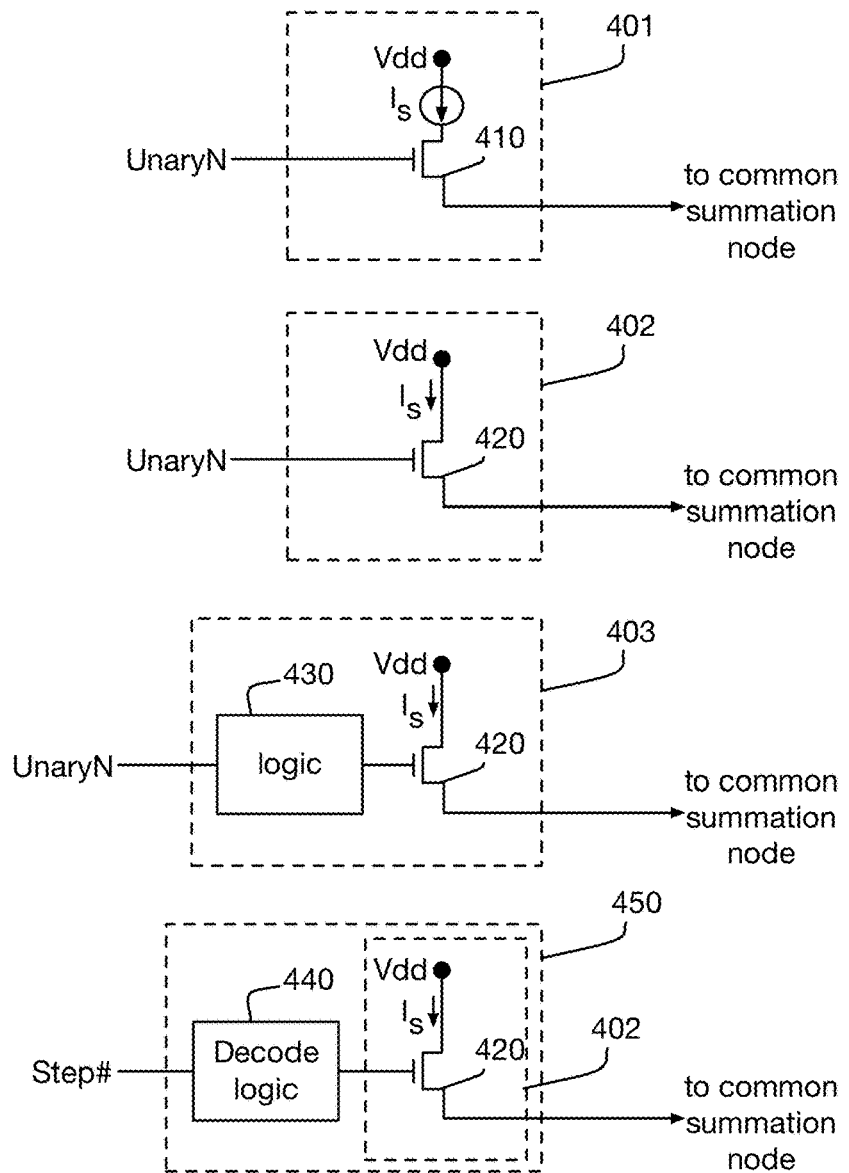
FIG. 4 illustrates schematics for NMOS gates, in accordance with some embodiments.

FIG. 4 illustrates several embodiments of the NMOS gate. Gate 401 utilizes a fixed current source to set output current $I_s$ which is then selectively passed by transistor 410 to the output under control of input UnaryN. Gate 402 is similar, but constrains output current $I_s$ by controlling the dimensions of transistor 420. Gate 403 optionally includes digital logic 430 such as a Boolean AND, OR, or other function in the input control signal path. In the further embodiment of Gate 450, digital logic 440 locally converts an input step# into an internal control signal used to control gate 402, in applications where such distributed logic is preferable to a centralized unary conversion and its multiple wire outputs. As all of the embodiments are functionally equivalent, the designation "400" is used in subsequent figures to identify the generic NMOS gate function performed.

TABLE I

| Step | Q | I |
|------|----|----|
| 0 | 0 | 22 |
| 1 | 1 | 22 |
| 2 | 2 | 22 |
| 3 | 3 | 21 |
| 4 | 4 | 21 |
| 5 | 5 | 21 |
| 6 | 6 | 21 |
| 7 | 7 | 20 |
| 8 | 8 | 20 |
| 9 | 9 | 20 |
| 10 | 10 | 19 |
| 11 | 11 | 19 |
| 12 | 12 | 18 |
| 13 | 13 | 17 |
| 14 | 14 | 16 |
| 15 | 15 | 16 |
| 16 | 16 | 15 |
| 17 | 16 | 14 |
| 18 | 17 | 13 |
| 19 | 18 | 12 |
| 20 | 19 | 11 |
| 21 | 19 | 10 |
| 22 | 20 | 9 |
| 23 | 20 | 8 |
| 24 | 20 | 7 |
| 25 | 21 | 6 |
| 26 | 21 | 5 |
| 27 | 21 | 4 |
| 28 | 21 | 3 |
| 29 | 22 | 2 |
| 30 | 22 | 1 |
| 31 | 22 | 0 |

Table I illustrates one embodiment of the curve-fitting function of Eqn. 3, where control steps 0-31 represent the 32 possible phase interpolation angles this embodiment provides. As may be seen, for control steps 0-16 the value of Q increases linearly; in the schematic of FIG. 5 this is represented as each of the NMOS gates 400 enabled by the unary encoding 510 of control step values 1-16 are connected to the common summing node for the Q control value, and as each such gate is consecutively enabled the current to the Q summing node increases incrementally. However, there is no comparable incremental increase for control step 17; in FIG. 5 this is embodied as the corresponding NMOS gate enabled by control step value 17 intentionally being unconnected to the common summing node for Q. Similarly, the remainder of gates 400 are connected to the common summing node for Q, except for the gates enabled by control step values 17 (as previously described), 21, 23, 24, 26, 27, 28, 30, and 31 which are not connected.

Figure 6:
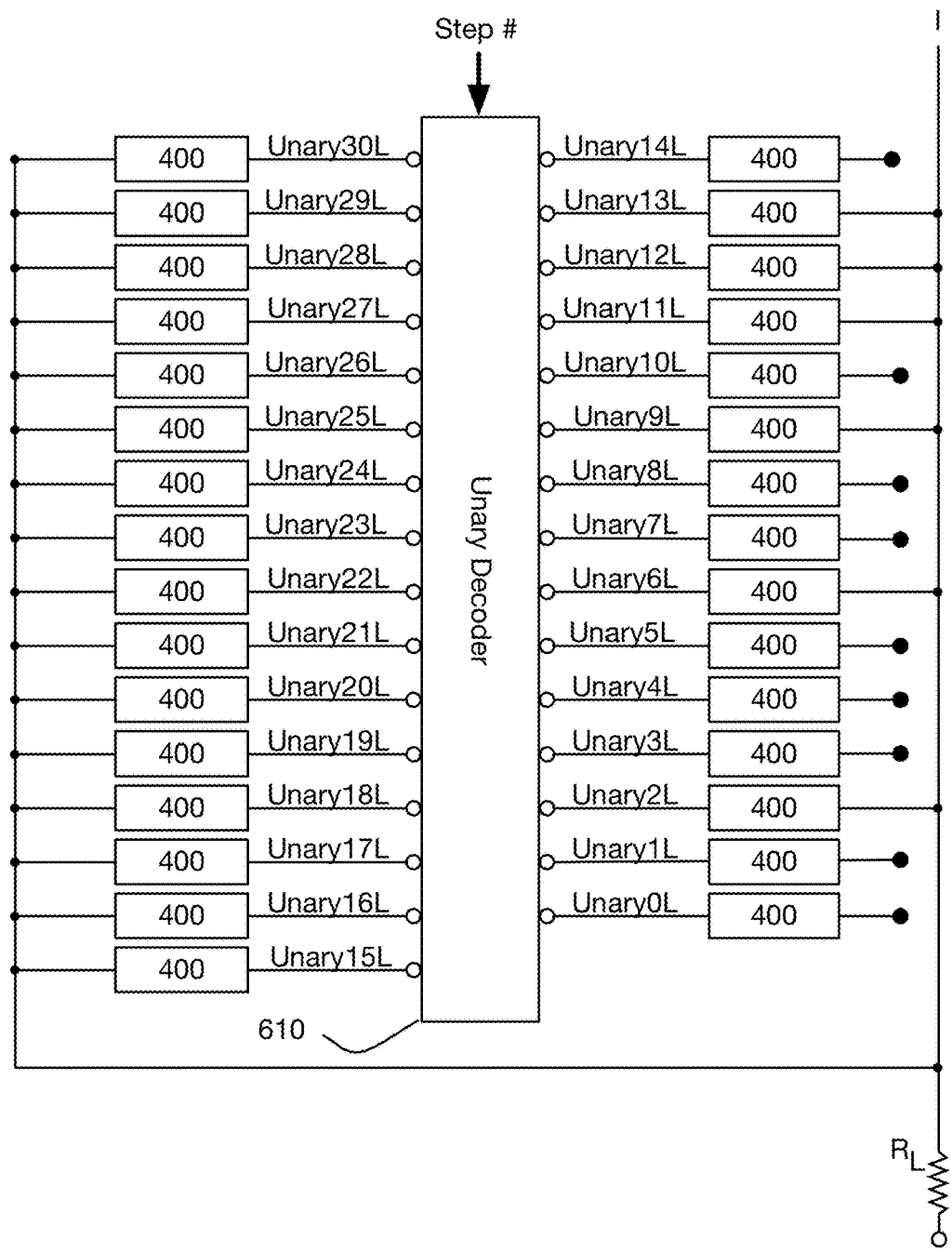
FIG. 6 is a schematic for producing an in-phase (I) control signal, in accordance with some embodiments.

FIG. 6 shows the equivalent schematic producing the I control signal. One familiar with digital logic will observe that a combination of the inverse sign of signals Unary0-Unary30 as well as connecting the signals in a reversed order produces the desired control effect for I, starting at a maximum for step#0 and slowly decreasing until step 12 in which there is subsequently an incremental decrease as step# increases. This is shown in FIG. 6 by the indication that unary decoder 610 outputs active-low signals Unary0L-Unary30L. In a practical embodiment, a single physical decoder (subsuming the illustrated 510 and 610 functions) may output both active high and active low signals to control both I and Q outputs. In some embodiments, the first set of control bits representing the Q signal and the second set of control bits representing the I signal have inverted signs and reversed order. In an alternative embodiment, two instances of an identical decoder may be used for 510 and 610, with the latter receiving step # signals that are logically inverted, thus producing the desired counting-down behavior for I.

Figure 7:
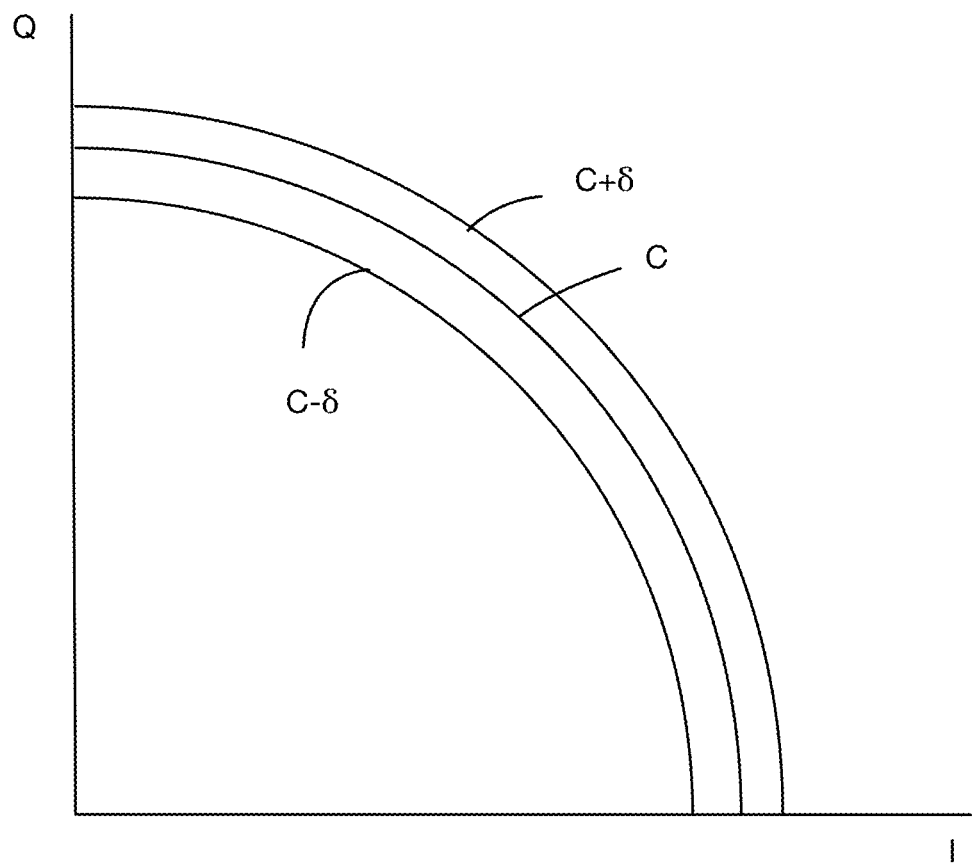
FIG. 7 illustrates a tolerance region, in accordance with some embodiments.

As shown in FIG. 3, the curve 310 approximately follows the unit circle shown in FIG. 2, however $I^2+Q^2$ does not equal a constant value. In some embodiments, a sum of squares of the first and second control signals $I^2$ and $Q^2$ respectively sum to within a predetermined threshold $\delta$ of a constant value C. FIG. 7 illustrates this concept. As shown in FIG. 7, a constant value C is chosen, which represents a sum of squares of the I and Q components. As long as a sum of squares of the I and Q components for each discrete step is within ±δ of C, there will be a linear change in phase with each step. That is to say:

$$|C-(I^2+Q^2)| \leq \delta \qquad \text{Eqn. 5}$$

In order to achieve the above constraint, additional incremental steps may be added to provide a higher resolution between steps. For example, in some embodiments, 64 or 128 steps may be used, however it should be noted that any number of steps is acceptable as long as Eqn. 5 is satisfied.

Figure 5:
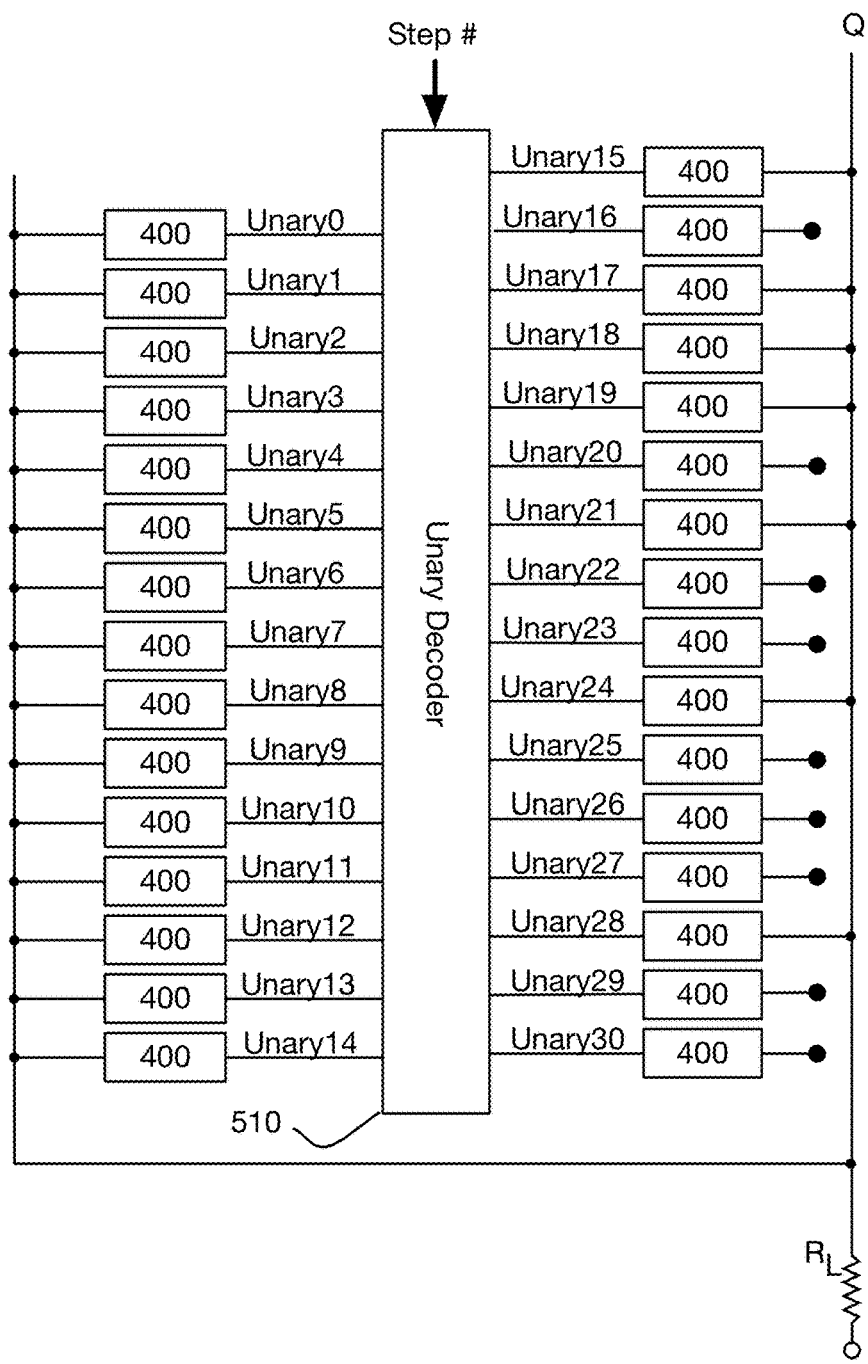
FIG. 5 is a schematic for producing a quadrature (Q) control signal, in accordance with some embodiments.

In one embodiment, the transistor drain providing the output for each NMOS gate 400 not connected to a summing node is connected to Vdd as shown in FIGS. 5 and 6; in an alternate embodiment, those transistor drains are open circuits; in a further embodiment, the output transistor for the unconnected gates is deleted. These variations provide equivalent function output behavior, while offering different trade-offs regarding circuit node loading and parasitic capacitance variation.

No limitation is implied in the descriptive example of 32 interpolation steps; other embodiments may provide different numbers of steps with higher or lower step granularity. Similarly, equivalent embodiments may be produced using PMOS gates and/or removal of incremental amounts of current from a common summation node rather than the example NMOS gates sourcing incremental amounts of current to a common summation node. Equivalent embodiments may also incorporate CMOS gates capable of both sinking and sourcing current to a common node. Similarly, functionally equivalent embodiments may utilize sets of gates driving summation nodes, wherein each gate is controlled by the decoding of a control value in another encoded form, for example as a binary code.

Figure 8:
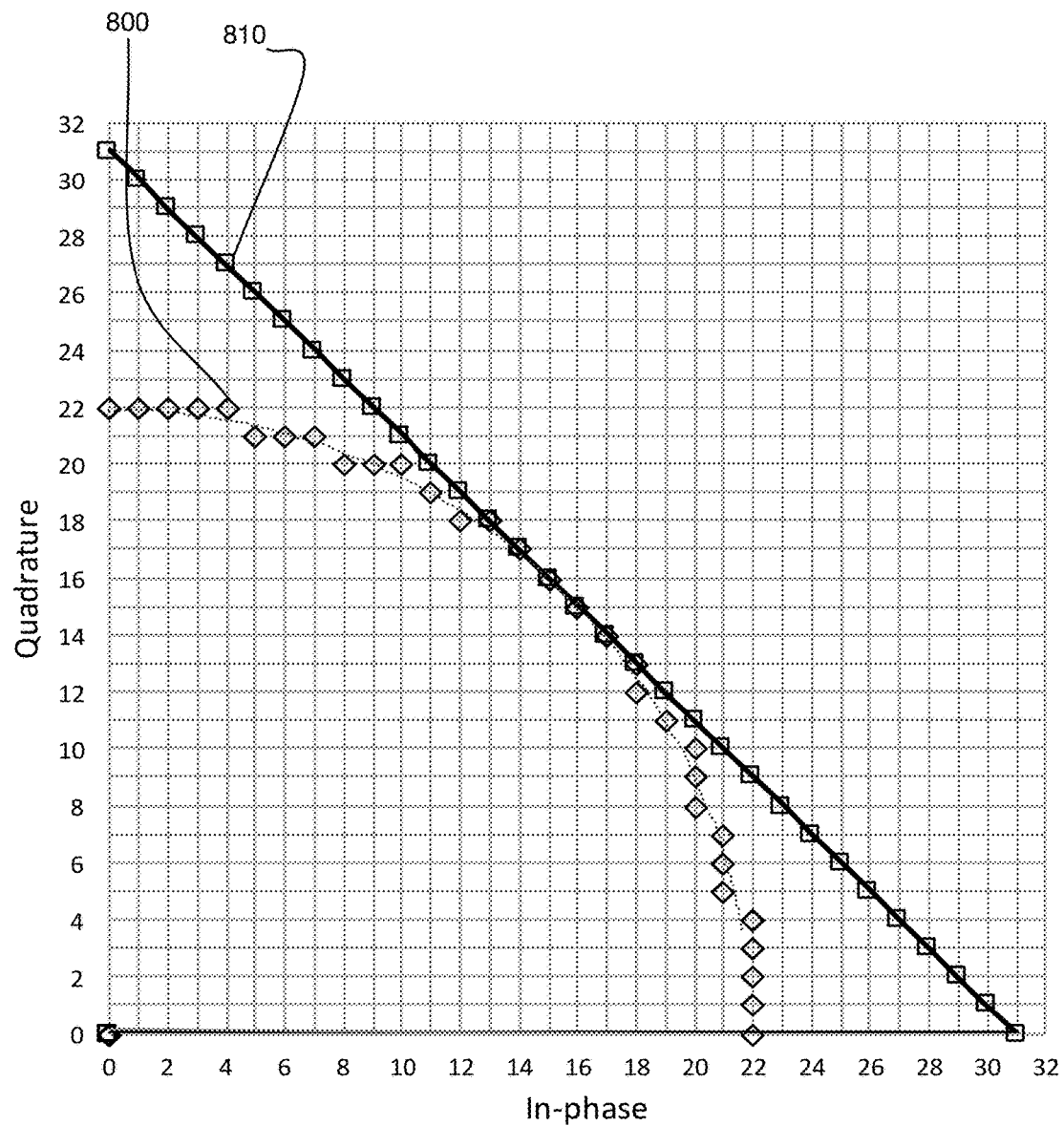
FIG. 8 is a graph of a fitted curve derived from a linear input.

FIG. 8 illustrates an approximation curve similar to the curve of FIG. 3. The curve shown in FIG. 8 represents the following table:

TABLE II

| Step | Q | I |
|------|----|----|
| 0 | 0 | 22 |
| 1 | 1 | 22 |
| 2 | 2 | 22 |
| 3 | 3 | 22 |
| 4 | 4 | 22 |
| 5 | 5 | 21 |
| 6 | 6 | 21 |
| 7 | 7 | 21 |
| 8 | 8 | 20 |
| 9 | 9 | 20 |
| 10 | 10 | 20 |
| 11 | 11 | 19 |
| 12 | 12 | 18 |

TABLE II-continued

| Step | Q | I |
|---|---|---|
| 13 | 13 | 18 |
| 14 | 14 | 17 |
| 15 | 15 | 16 |
| 16 | 16 | 15 |
| 17 | 17 | 14 |
| 18 | 18 | 13 |
| 19 | 18 | 12 |
| 20 | 19 | 11 |
| 21 | 20 | 10 |
| 22 | 20 | 9 |
| 23 | 20 | 8 |
| 24 | 21 | 7 |
| 25 | 21 | 6 |
| 26 | 21 | 5 |
| 27 | 22 | 4 |
| 28 | 22 | 3 |
| 29 | 22 | 2 |
| 30 | 22 | 1 |
| 31 | 22 | 0 |

Figure 9:
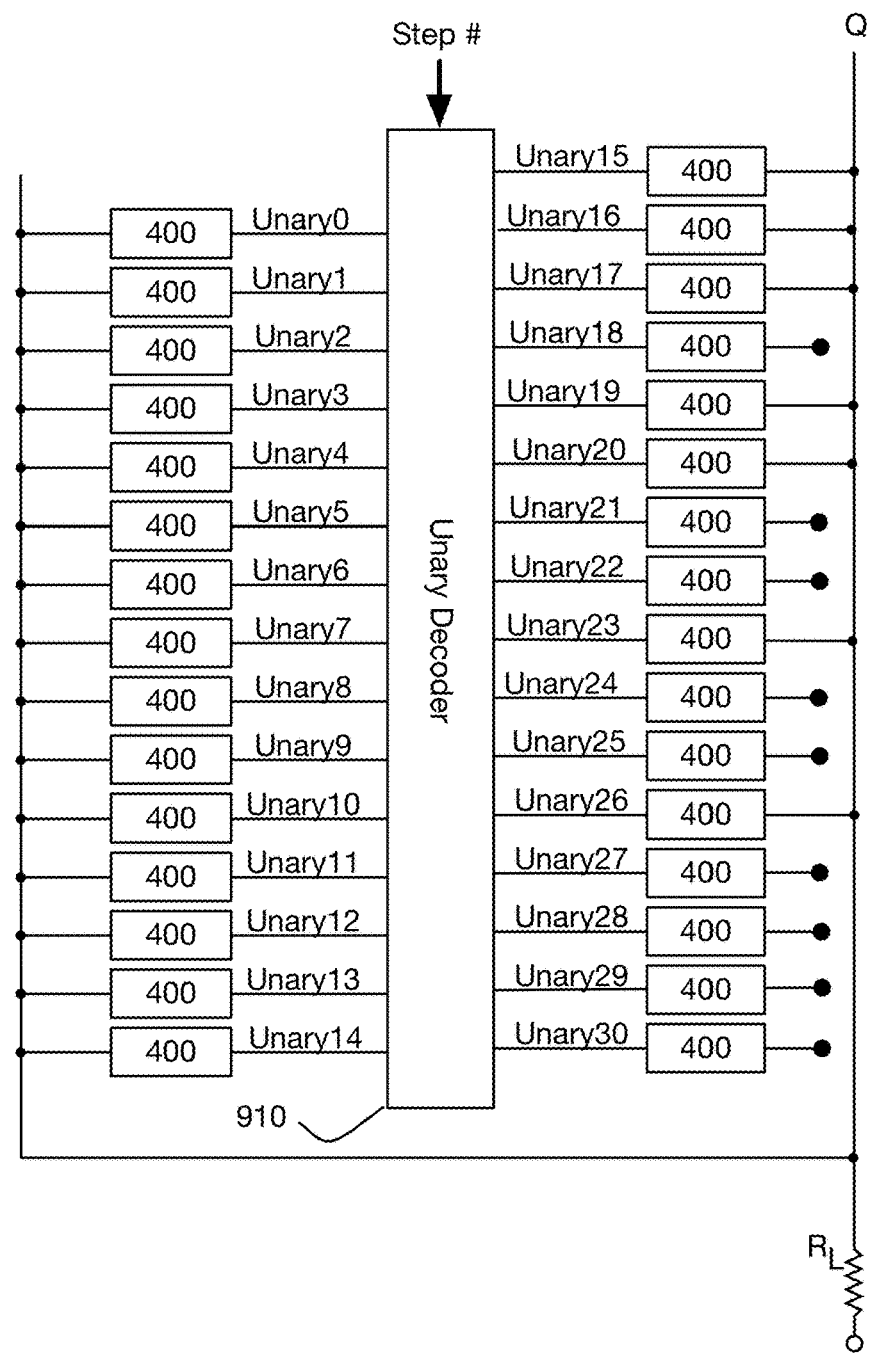
FIG. 9 is a schematic for producing a Q control signal, in accordance with some embodiments.
Figure 10:
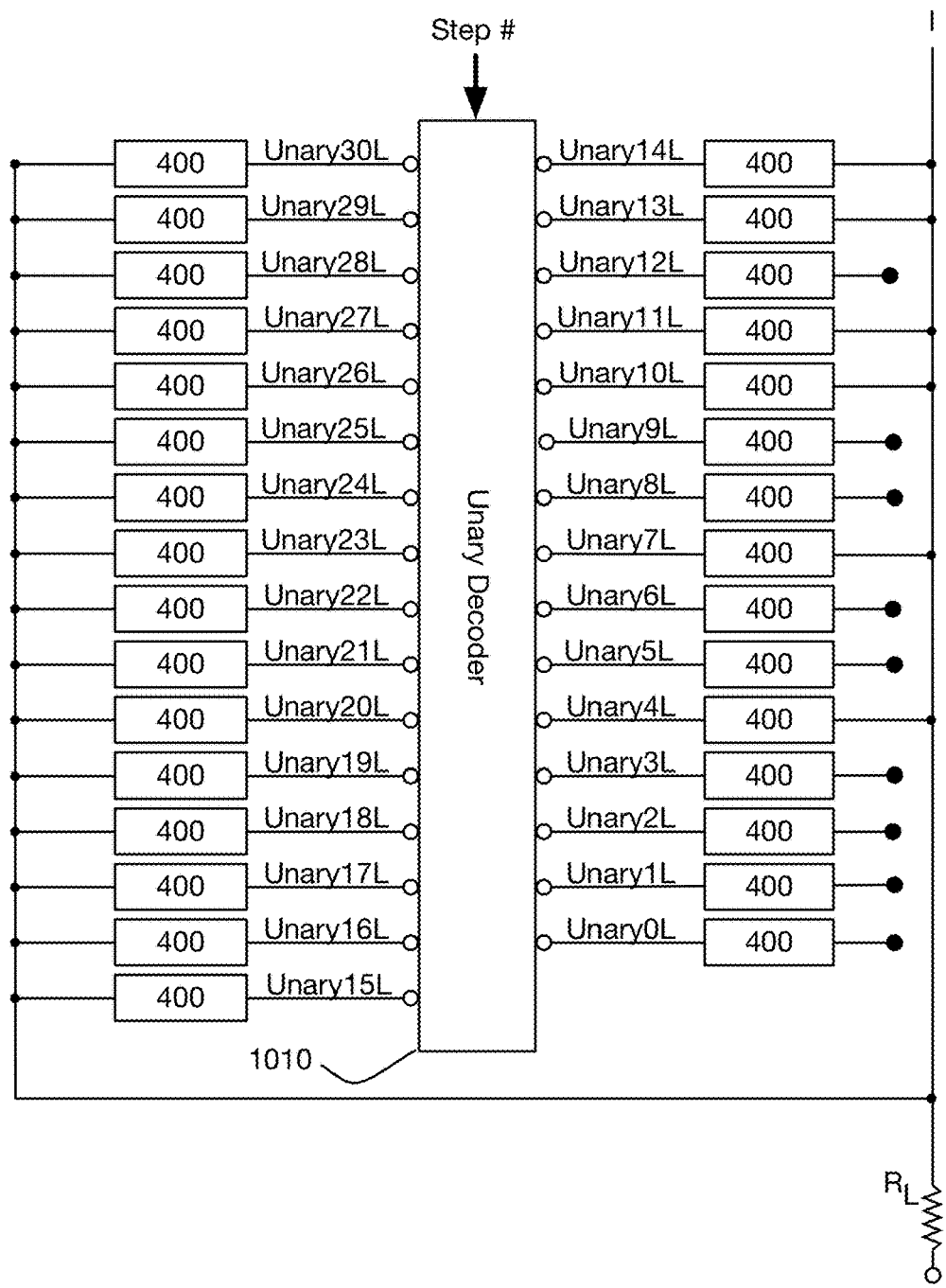
FIG. 10 is a schematic for producing an I control signal, in accordance with some embodiments.

The corresponding schematics for the generation of the Q and I signals are given in FIGS. 9 and 10, respectively.

Figure 12:
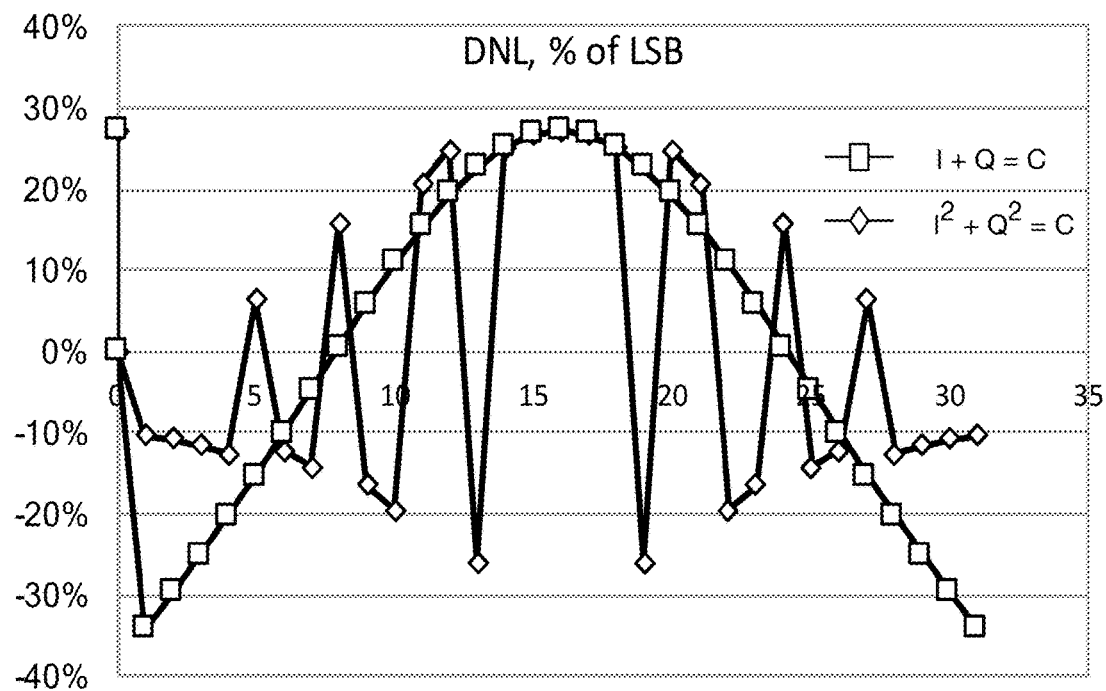
FIG. 12 is a graph illustrating differential non-linearity (DNL), in accordance with some embodiments.
Figure 13:
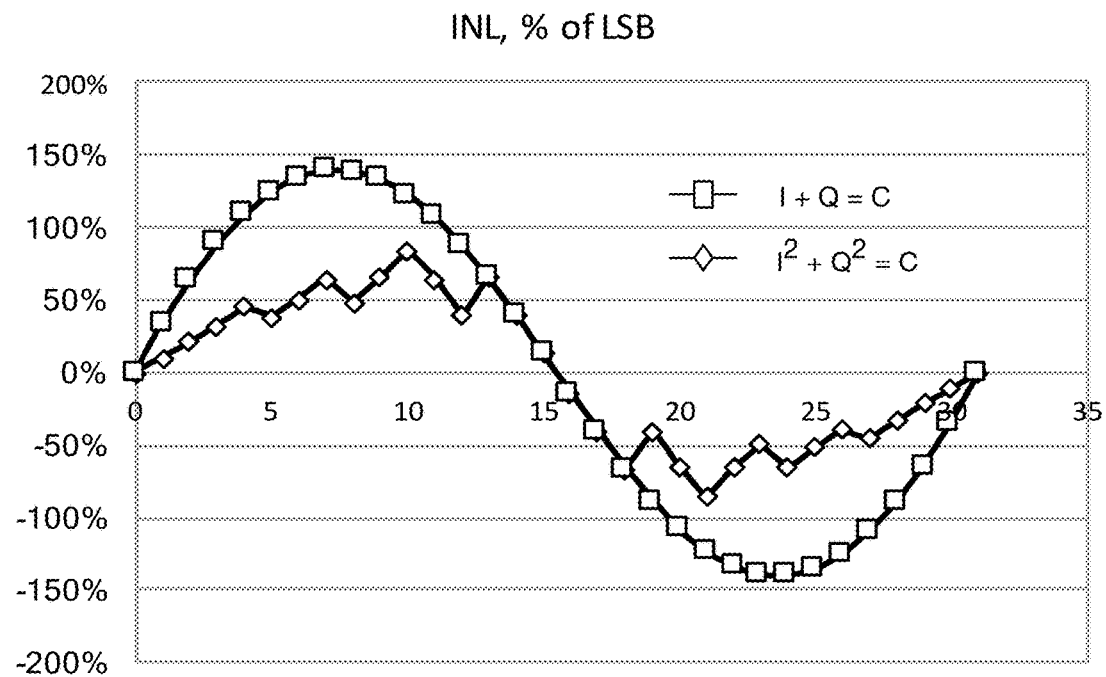
FIG. 13 is a graph illustrating integral non-linearity (INL), in accordance with some embodiments.
Figure 14:
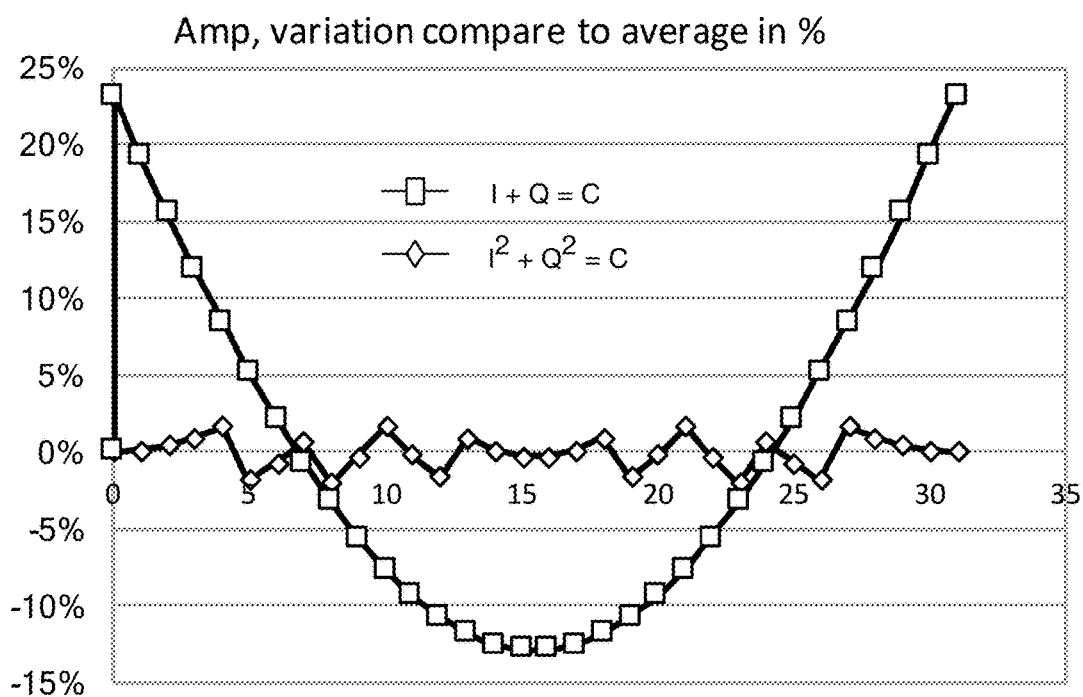
FIG. 14 is a graph illustrating amplitude variation, in accordance with some embodiments.

FIGS. 12-14 are plots comparing performance of a conventional PI to PIs in accordance with embodiments described above. In each plot, the PIs receive two reference clocks having 90 degree phase differences. FIG. 12 is a graph illustrating differential non-linearity (DNL). As shown, the maximum value of DNL is approximately the same, however the proposed PI demonstrates smaller mean absolute deviation of DNL as compared to the conventional PI.

FIG. 13 is a graph illustrating integral non-linearity (INL) for a PI in accordance with embodiments described above against the conventional PI. FIG. 13 illustrates that INL improves from ±1.4 LSB to ±0.85 LSB. In both PIs, increasing the number of bits does not have a significant effect on the INL.

FIG. 14 is a graph illustrating amplitude variation at the output of PIs versus the PI code. Amplitude variation is converted to phase error in the next stages. Amplitude to Phase conversion is one of the main sources of phase error, causing PI nonlinearity. As shown, proposed embodiments demonstrate significant improvement in amplitude variation compare to conventional PIs. Further, amplitude variation may be improved by increasing number of bits in the proposed PI, unlike in Conventional PI which amplitude variation is rather independent of number of bits.

Figure 15:
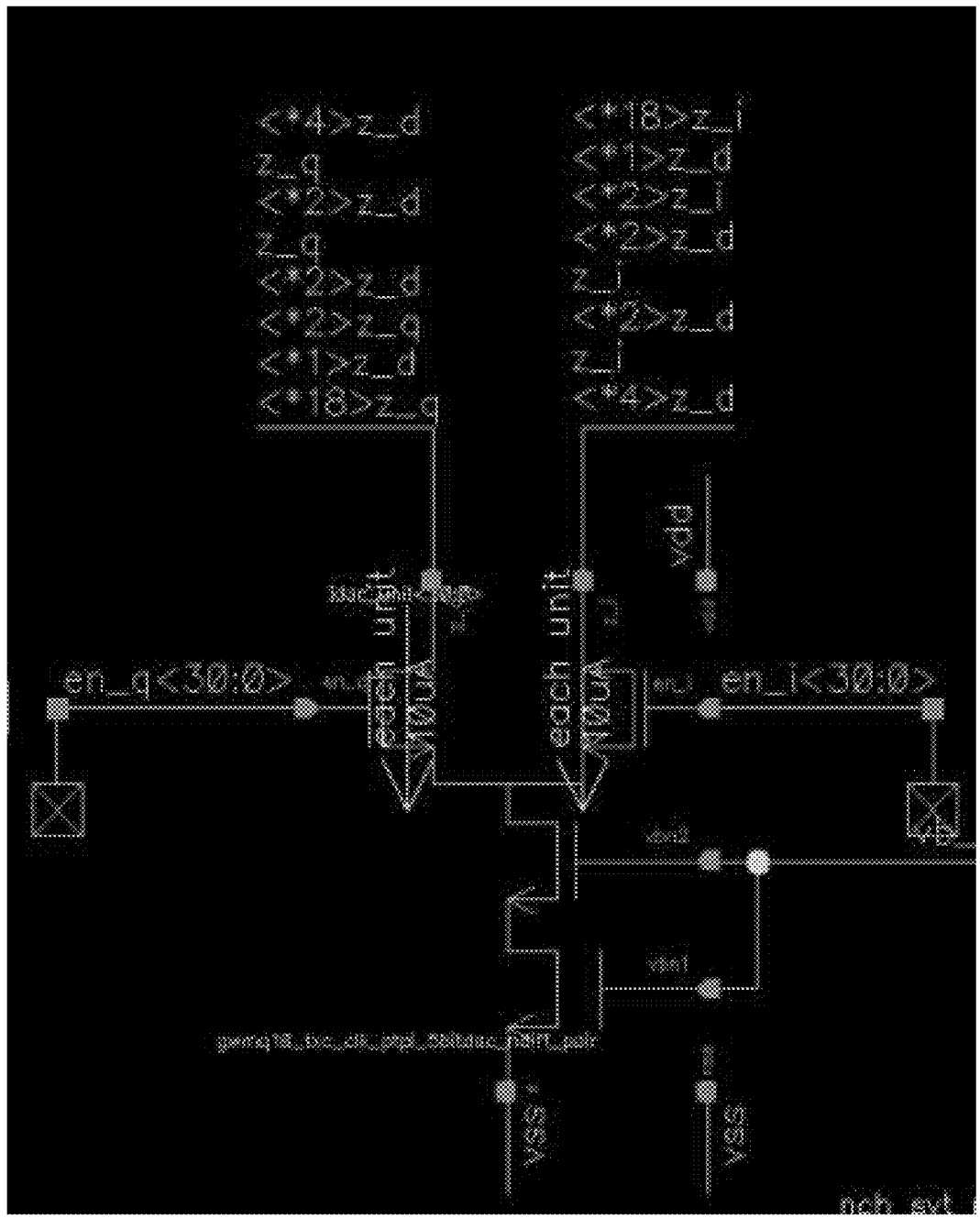
FIG. 15 is a schematic for a digital-to-analog converter (DAC), in accordance with some embodiments.

FIG. 15 is a schematic of a DAC for generating the I and Q control signals, in accordance with some embodiments. As shown, the DAC in FIG. 15 implements the schematics of FIGS. 9 and 10. The DAC shows a differential pair (representing 31 differential pairs), each receiving a corresponding bit of the 31-bit thermometer code (en_q and en_i). Further, FIG. 15 describes the connection of each transistor. For example, looking at the transistor connected to en_q<30:0>, it is seen that the first 18 transistors (denoted <*18>z_q) are connected to the Q common output node, the next transistor (denoted <*1>z_d) is disconnected from the Q common output node, and so on. Same can be said for the transistors connected to en_i<30:0>, in that the first four transistors (<*4>z_d) are disconnected from the I common output node, and the next transistor (<*1>z_i) is connected to the I common output node.

Figure 16A:
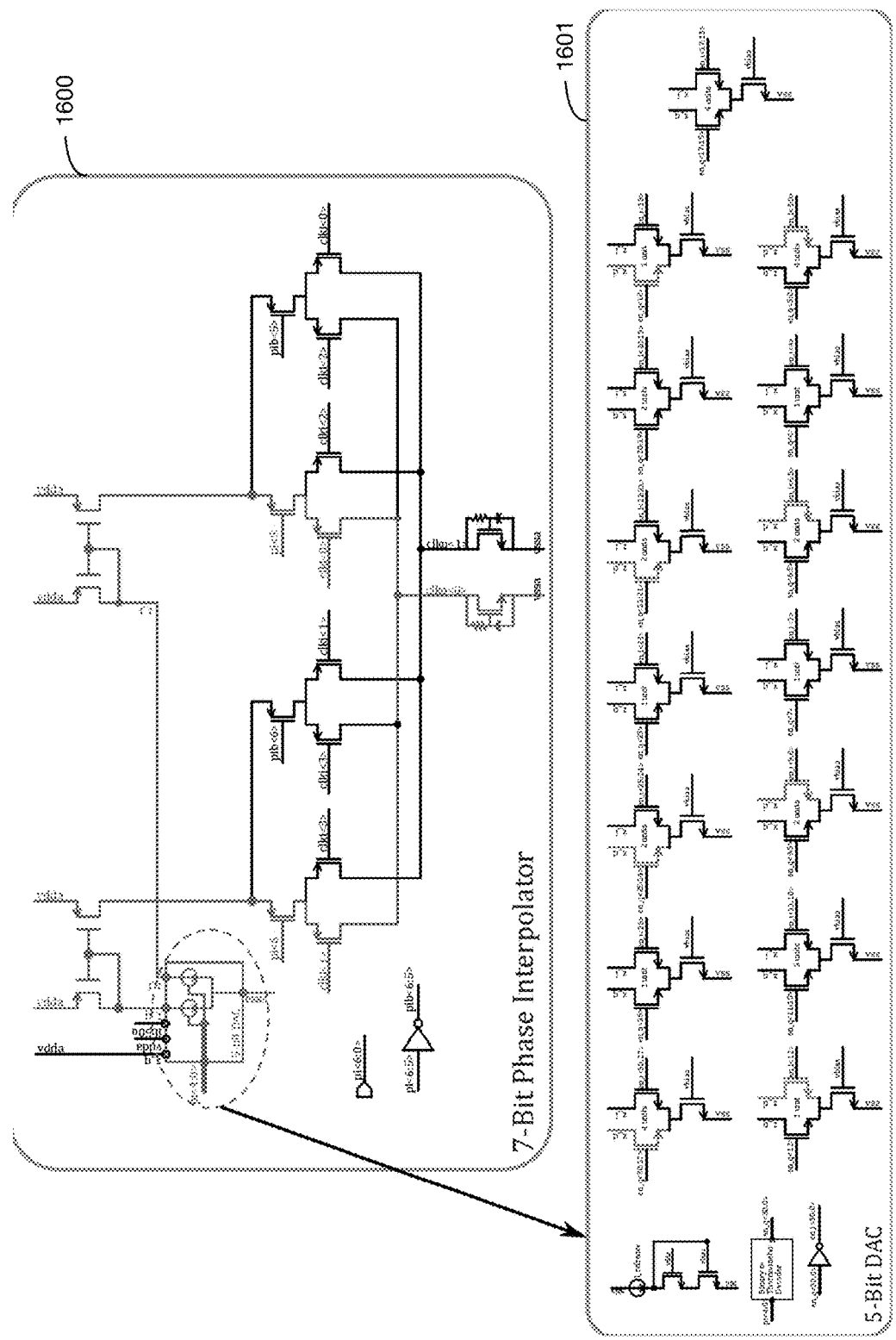
FIGS. 16A-16D are schematics for a phase-interpolator (PI), in accordance with some embodiments.

FIG. 16A illustrates a 7-bit phase interpolator 1600, in accordance with some embodiments. As shown, the phase interpolator includes a 5-bit DAC 1601 generating I and Q control signals using inputs pi<0:4>, as well as a pair of selection bits pi<5:6> for selecting a phase quadrant. The DAC embodiment given in FIGS. 16C and 16D illustrate generation of the I and Q control signals in accordance with the schematics depicted in FIGS. 9 and 10, as well as described by Table II. As shown in FIGS. 16C and 16D, the DAC includes a plurality of differential pairs, each differential pair comprising a first transistor and a second transistor connected to a corresponding current source of a plurality of current sources having equal magnitude. In some embodiments, the magnitude of the current sources is controlled by adjusting a bias current, as shown by adjusting vbias. It should be noted that alternative embodiments may utilize the circuits of FIG. 4. As shown, each differential pair receives a corresponding bit en_q<30:0> of a thermometer codeword at an input of the first transistor and a complement of the corresponding bit en_i <30:0> at an input of the second transistor. The bits of the thermometer code may be generated using binary to thermometer decoder 1612, and the complements en_i<30:0> may be formed by passing thermometer code bits en_q<30:0> through inverter 1618. As shown, the plurality of differential pairs includes a first and a second subset of differential pairs. The first subset of differential pairs has the first transistor connected to a quadrature-phase (Q) common node and the second transistor connected to an in-phase (I) common node. An example differential pair in the first subset is represented by the differential pair 1620 receiving en_q <26> and en_i <26>. The DAC further includes a second subset of differential pairs having either (i) the first transistor connected to the Q common node and the second transistor is disconnected from the I common mode or (ii) the first transistor is disconnected from the Q common node second transistor connected to the I common node. An example differential pair in the second subset is represented by the differential pair 1625 receiving en_q<12> and en_i<12>, where the first transistor is connected to the Q common node and the second transistor is disconnected from the I common node by connecting it to VDD.

Figure 16B:
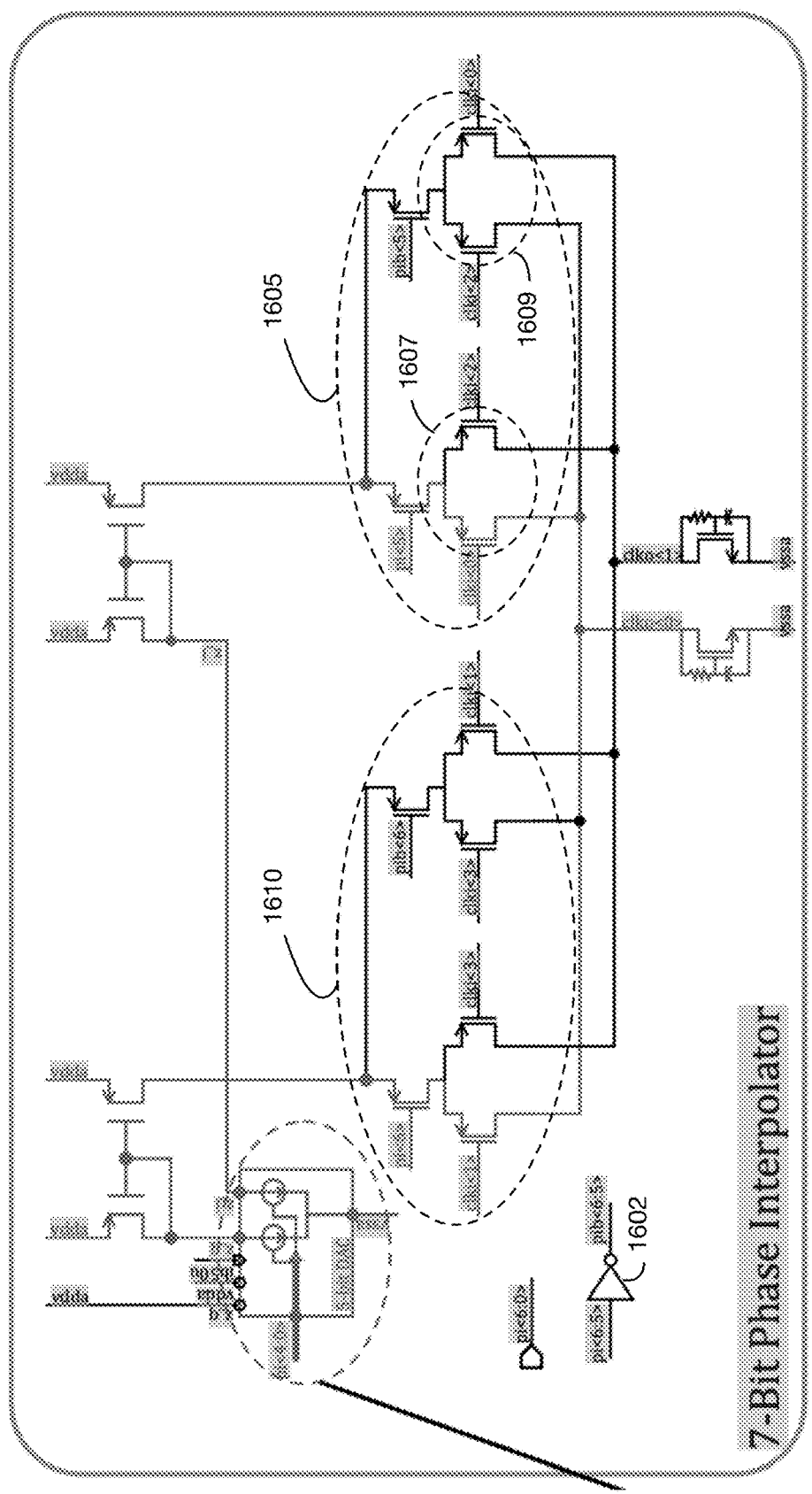
Figure 16C:
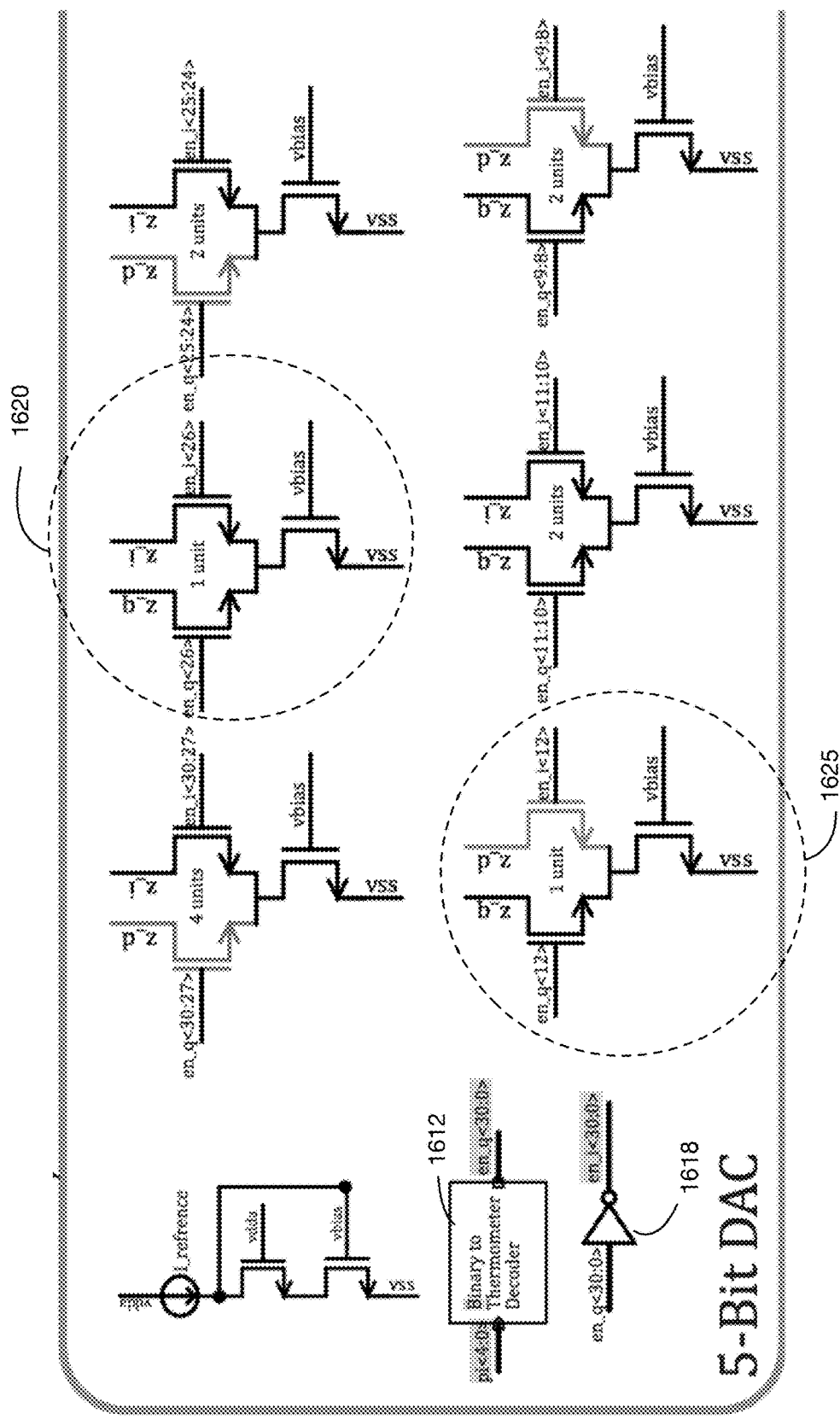
Figure 16D:
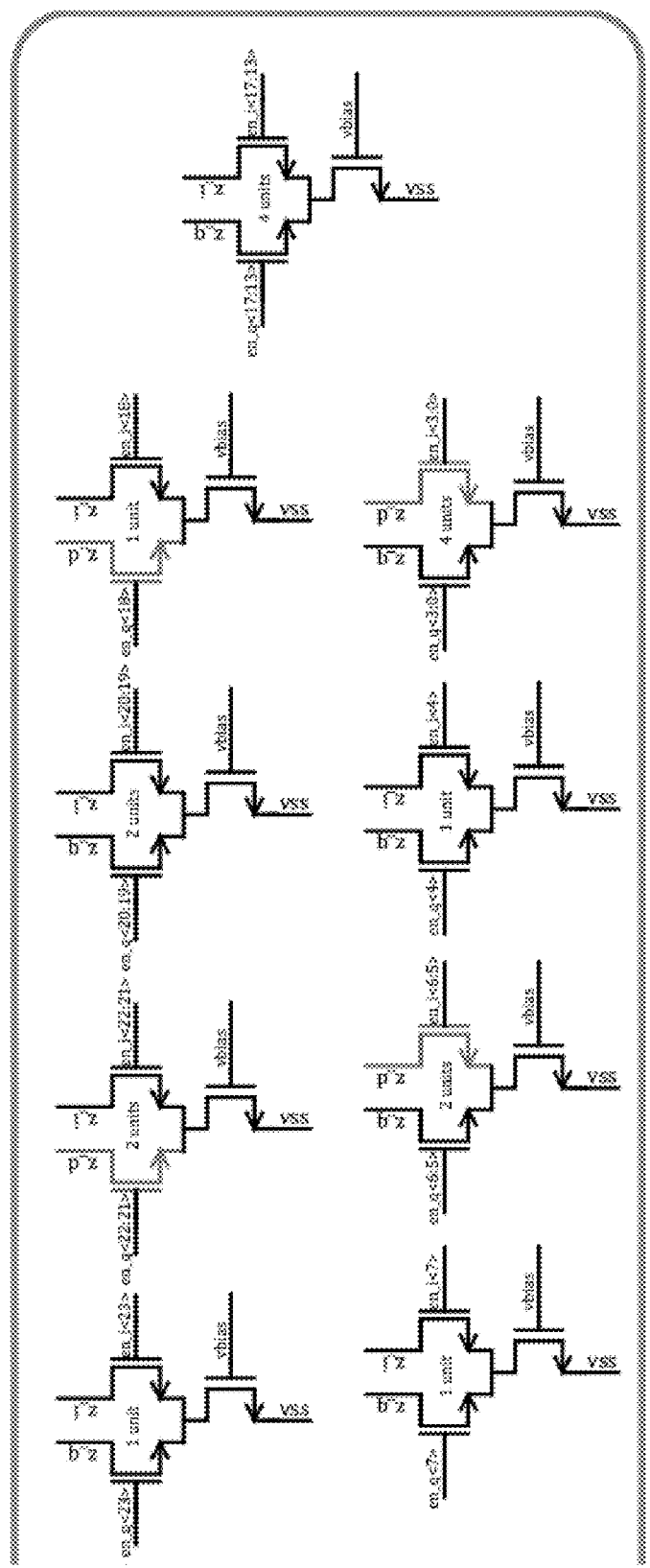

FIG. 16B illustrates phase interpolator 1600 connected to the DAC 1601 described above. As shown, the PI includes a pair of selection circuits 1605 and 1610. The first selection circuit 1605 is connected to a current mirror connected to the I common node and receives a first reference signal (clki<0>/clki<2>), while the second selection circuit 11610 is connected to a current mirror connected to the Q common node and receives a second reference signal (clki<1>/clki<3>). As described above, I and Q control signals are formed from the plurality of differential pairs in the DAC drawing respective currents through the I and Q common nodes (shown as z_i and z_q respectively). Each selection circuit also receives a corresponding selection bit to determine a polarity of the corresponding reference signal. As shown, selection circuit 1605 receives selection bit pi<5> (and its complement pib<5>), while selection circuit 1610 receives selection bit pi<6> (and its complement pib<6>). As shown in FIG. 16B, the complements may be provided by inverter 1602.

As described above, the first selection circuit 1605 receives the first reference signal clki<0>/clki<2>. Clki<0> and clki<2> may be 180 degrees offset clock signals, and the selection circuit is configured to determine which polarity to connect to the output node for the interpolated signal clko<0>/clko<1>. As shown, if pi<5>=1, a first differential pair 1607 is enabled connecting clki<0> to clko<0> and clki<2> to clko<1>. Similarly, if pi<5>=0 (and thus pib<5>=1), a second differential pair 1609 is enabled connecting clki<2> to clko<0> and clki<0> to clko<1>. The second selection circuit 1610 operates in a similar manner in order to connect the second reference signal to the output node for the interpolated signal. Through the use of the selection circuits, pi<5> and pi<6> may select which quadrant of phase to interpolate from. Table III below illustrates this relationship:

TABLE III

| Pi<br><5> | Pi<br><6> | Phase Range<br>(Degrees) |
|---|---|---|
| 0 | 0 | 0-90 |
| 1 | 0 | 90-180 |
| 1 | 1 | 180-270 |
| 0 | 1 | 270-360 |

Figure 17:
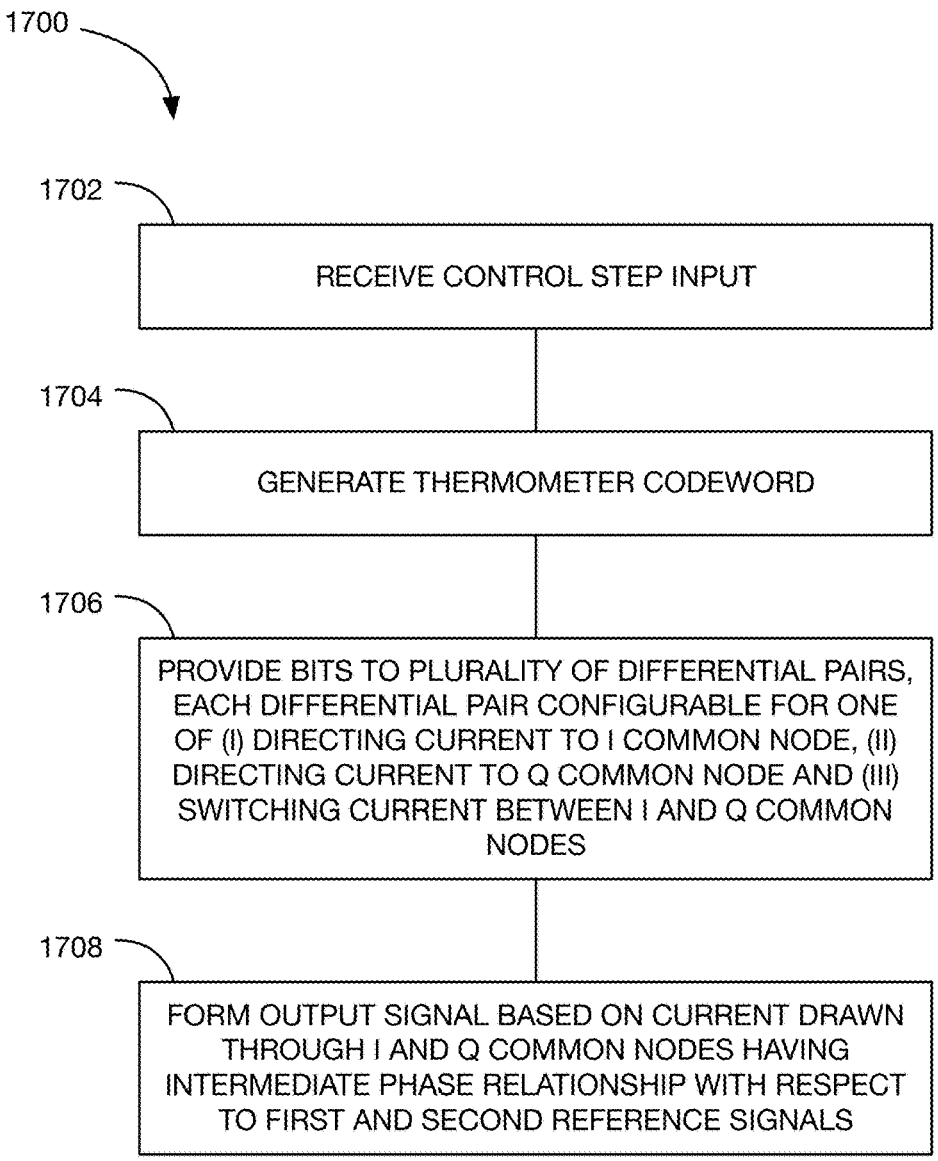
FIG. 17 is a flowchart of a method, in accordance with some embodiments.

FIG. 17 illustrates a flowchart of a method 1700, in accordance with some embodiments. As shown, method 1700 includes receiving, at 1702, a control step input at a binary-to-thermometer decoder and responsively generating, at 1704, bits of a thermometer codeword representative of the control step input. At step 1706, the bits of the thermometer codeword are provided to a plurality of differential pairs comprising a first transistor and a second transistor connected to a corresponding current source of a plurality of current sources having equal magnitude. Each differential pair receives a corresponding bit of the thermometer codeword at an input of the first transistor and a complement of the corresponding bit at an input of the second transistor. Further, each differential pair is configurable for one of (i) directing current to an in-phase (I) common node (ii) directing current to a quadrature phase (Q) common node, and (iii) switching between directing current to the I common node and the Q common node. At 1708, an output signal is formed based on current drawn through the I and Q common nodes, the output signal having an intermediate phase with respect to a first and a second reference signal In some embodiments, the control step input comprises 5 bits the thermometer codeword comprises 31 bits. In some embodiments, the complements of the bits of the thermometer code are generated using an inverter. In some embodiments, a sum of squares of the I and Q control signals is within a threshold of a predetermined constant C. In some embodiments, the first and second reference signals have a phase difference of 90 degrees. In some embodiments, the first and second reference signals are sinusoidal signals. Alternatively, the first and second reference signals may be square wave signals.

In some embodiments, the method further includes determining polarities of the first and second reference signals according to first and second selection bits received at first and second selection circuits, respectively. In some embodiments, determining the polarity of a given reference signal includes enabling one transistor of a pair of transistors associated with the corresponding selection circuit, each transistor of the pair receiving the given reference signal in opposite polarity. In some embodiments, a first transistor of the pair of transistors is enabled according to the selection bit and wherein a second transistor of the pair of transistors is disabled according to a complement of the selection bit.

The invention claimed is:

1. An apparatus comprising:
a binary-to-thermometer decoder configured to receive a control step input and to responsively generate a thermometer codeword representative of the control step input;
a plurality of differential pairs configured to generate in-phase (I) and quadrature phase (Q) control signals by drawing respective currents through I and Q common nodes, each differential pair comprising a first transistor and a second transistor connected to a corresponding current source of a plurality of current sources having equal magnitude, each differential pair configured to receive a corresponding bit of the thermometer codeword at an input of the first transistor and a complement of the corresponding bit at an input of the second transistor, the plurality of differential pairs comprising:
a first subset of differential pairs having the first transistor connected to the I common node and the second transistor connected to the Q common node, each differential pair in the first subset configured to control the I and Q control signals; and
a second subset of differential pairs, the second subset of differential pairs comprising (i) differential pairs having the first transistor connected to the I common node and the second transistor disconnected from the Q common node to control only the I control signal and (ii) differential pairs having the first transistor disconnected from the I common node and the second transistor connected to the Q common node to control only the Q control signal; and
a phase interpolator configured to receive (i) first and second reference signals and (ii) the I and Q control signals and to responsively generate an interpolated signal on a differential output node by adding amounts of the first and second reference signals, the amounts of the first and second reference signals determined by magnitudes of the I and Q control signals, respectively.

2. The apparatus of claim 1, wherein the binary-to-thermometer decoder is configured to receive 5 bits and to generate a thermometer codeword having 31 bits.

3. The apparatus of claim 1, further comprising an inverter configured to generate the complements of the bits of the thermometer code.

4. The apparatus of claim 1, wherein a sum of squares of the I and Q control signals is within a threshold of a predetermined constant C.

5. The apparatus of claim 1, wherein the first and second reference signals have a phase difference of 90 degrees.

6. The apparatus of claim 1, wherein the first and second reference signals are sinusoidal signals.

7. The apparatus of claim 1, wherein the first and second reference signals are square wave signals.

8. The apparatus of claim 1, wherein the phase interpolator further comprises respective selection circuits connected to each of the I and Q common nodes, each selection circuit configured to receive a respective reference signal and a corresponding selection bit, the selection circuit configured to determine a polarity of the respective reference signal according to the selection bit.

9. The apparatus of claim 8, wherein each selection circuit comprises two differential pairs of transistors differentially receiving the respective reference signal, each differential pair configured to receive the reference signal in opposite polarity.

10. The apparatus of claim 9, wherein a first differential pair of the two differential pairs is enabled according to the corresponding selection bit and wherein the second differential pair is enabled according to a complement of the corresponding selection bit.

11. A method comprising:
receiving a control step input at a binary-to-thermometer decoder and responsively generating bits of a thermometer codeword representative of the control step input;
providing the bits of the thermometer codeword to a plurality of differential pairs comprising a first transistor and a second transistor connected to a corresponding current source of a plurality of current sources having equal magnitude, each differential pair receiving a corresponding bit of the thermometer codeword at an input of the first transistor and a complement of the corresponding bit at an input of the second transistor;
generating I and Q control signals by drawing respective currents through respective I and Q common nodes via the current sources connected to the plurality of differential pairs, each of the I and Q control signals generated by configuring each differential pair to (i) direct current to only the I common node (ii) to direct current to only the Q common node, or (iii) to switch between directing current to the I common node and the Q common node; and
providing (i) a first and a second reference signal and (ii) the I and Q control signals to a phase interpolator, and responsively forming an output signal on a differential output node by adding amounts of the first and second reference signals, the amounts of the first and the second reference signals determined by magnitudes of the I and Q control signals, respectively, the output signal having an intermediate phase with respect to the first and the second reference signals.

12. The method of claim 11, wherein the control step input comprises 5 bits the thermometer codeword comprises 31 bits.

13. The method of claim 11, wherein the complements of the bits of the thermometer code are generated using an inverter.

14. The method of claim 11, wherein a sum of squares of the I and Q control signals is within a threshold of a predetermined constant C.

15. The method of claim 11, wherein the first and second reference signals have a phase difference of 90 degrees.

16. The method of claim 11, wherein the first and second reference signals are sinusoidal signals.

17. The method of claim 11, wherein the first and second reference signals are square wave signals.

18. The method of claim 11, further comprising determining polarities of the first and second reference signals according to first and second selection bits received at first and second selection circuits, respectively.

19. The method of claim 18, wherein determining the polarity of a given reference signal comprises enabling one transistor of a pair of transistors associated with the corresponding selection circuit, each transistor of the pair receiving the given reference signal in opposite polarity.

20. The method of claim 19, wherein a first transistor of the pair of transistors is enabled according to the selection bit and wherein a second transistor of the pair of transistors is disabled according to a complement of the selection bit.

* * * * *